United States Patent
Osborne

(10) Patent No.: US 7,269,088 B2
(45) Date of Patent: Sep. 11, 2007

(54) IDENTICAL CHIPS WITH DIFFERENT OPERATIONS IN A SYSTEM

(75) Inventor: Randy B. Osborne, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 11/131,572

(22) Filed: May 17, 2005

(65) Prior Publication Data

US 2006/0262632 A1 Nov. 23, 2006

(51) Int. Cl.
*G11C 8/00* (2006.01)

(52) U.S. Cl. ............................ 365/230.05; 365/230.03; 365/63

(58) Field of Classification Search ........... 365/230.05, 365/230.03, 63
See application file for complete search history.

(56) References Cited

U.S. PATENT DOCUMENTS

| | | | |
|---|---|---|---|
| 5,367,480 A * | 11/1994 | Matsumiya | 365/63 |
| 6,373,289 B1 | 4/2002 | Martin et al. | |
| 6,493,250 B2 | 12/2002 | Halbert et al. | |
| 6,658,509 B1 | 12/2003 | Bonella et al. | |
| 6,697,888 B1 | 2/2004 | Halbert et al. | |
| 6,742,098 B1 | 5/2004 | Halbert et al. | |
| 6,747,474 B2 | 6/2004 | Borkar et al. | |
| 6,847,617 B2 | 1/2005 | Borkar et al. | |
| 2003/0026287 A1* | 2/2003 | Mullendore et al. | 370/442 |
| 2004/0019743 A1 | 1/2004 | Au et al. | |

FOREIGN PATENT DOCUMENTS

EP 0 366 588 A2 5/1990
WO WO 2005/003955 A2 1/2005

OTHER PUBLICATIONS

Int'l Application No. PCT/US2006/017048, Int'l Search Report & Written Opinion dated Sep. 19, 2006.

* cited by examiner

*Primary Examiner*—Huan Hoang
(74) *Attorney, Agent, or Firm*—Alan K. Aldous

(57) ABSTRACT

In some embodiments, a chip includes a memory core, control circuitry, and first ports, second ports, and third ports. The first ports are to only receive signals, the second ports are to only provide signals, and the control circuitry is to control whether the third ports are to only receive signals or only provide signals. Other embodiments are described and claimed.

22 Claims, 6 Drawing Sheets

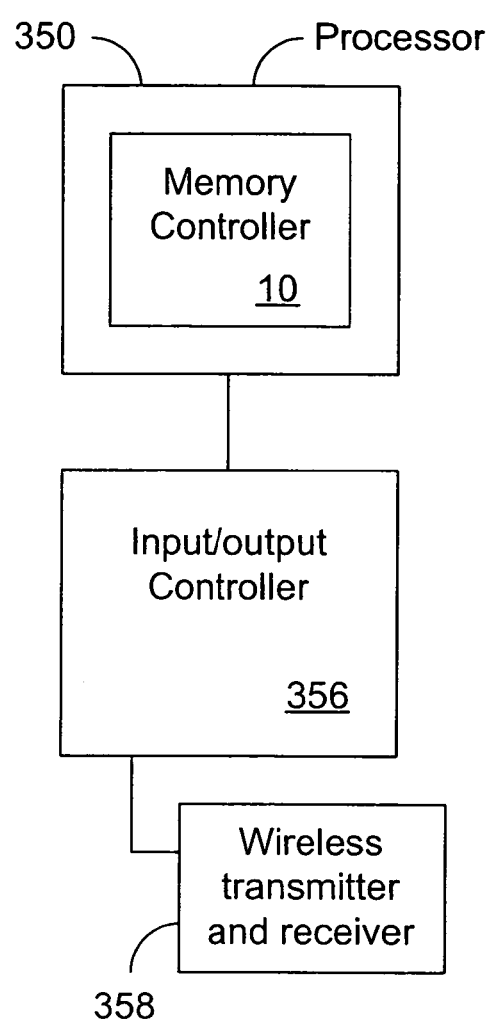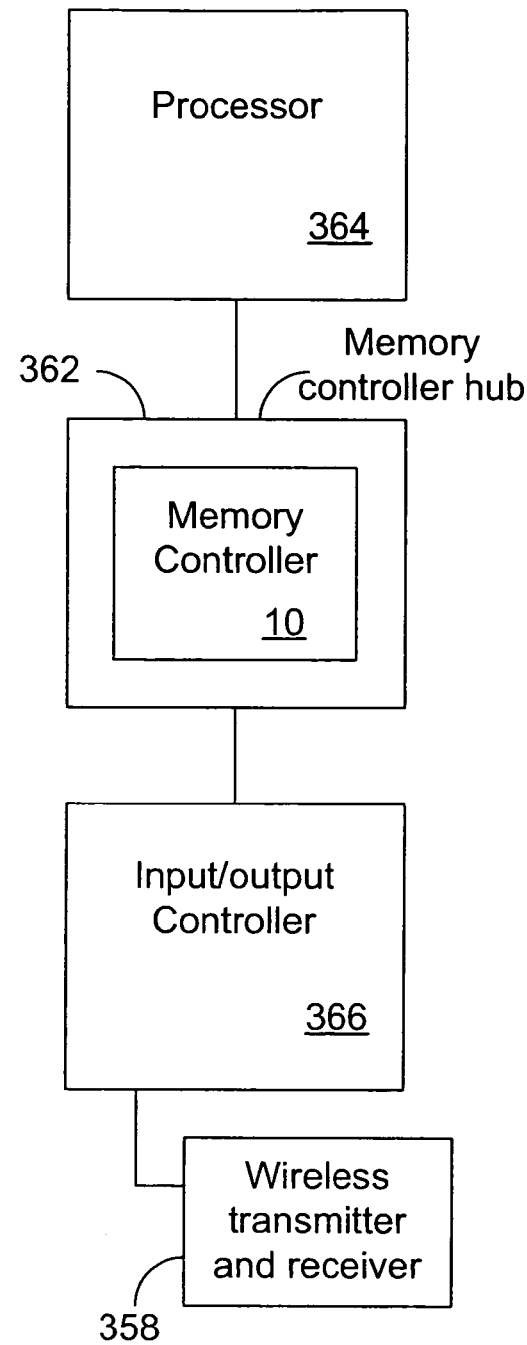
FIG. 10
FIG. 11

IDENTICAL CHIPS WITH DIFFERENT OPERATIONS IN A SYSTEM

BACKGROUND

1. Technical Field

The present inventions relate to chips which operate differently depending on where they are positioned in a system.

2. Background Art

Various arrangements for memory chips in a memory system have been proposed. For example, in a traditional synchronous dynamic random access memory (DRAM) system, memory chips communicate data through bidirectional data buses and receive commands and addresses through command and addresses buses. The memory chips have stubs that connect to the buses.

In other memory systems, a memory chip receives signals and repeats them to a next memory chip in a series of two or more memory chips. In some of these systems, the last memory chip in the series can send a signal directly back to a memory controller or other originating chip. This is referred to as a ring.

Memory modules include a substrate on which a number of memory chips are placed. The memory chips may be placed on only one side of the substrate or on both sides of the substrate. In some systems, a buffer is also placed on the substrate. For at least some signals, the buffer interfaces between the memory controller and the memory chips on the module. In such a buffered system, the memory controller can use different signaling (for example, frequency and voltage values, and point-to-point versus a multi-drop arrangement) with the buffer than the buffer uses with the memory chips. Some computer systems include wireless transmitter and receiver circuits.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

FIGS. 10-11 are each a block diagram representation of a system including a memory controller according to some embodiments of the inventions.

DETAILED DESCRIPTION

Figure 1:
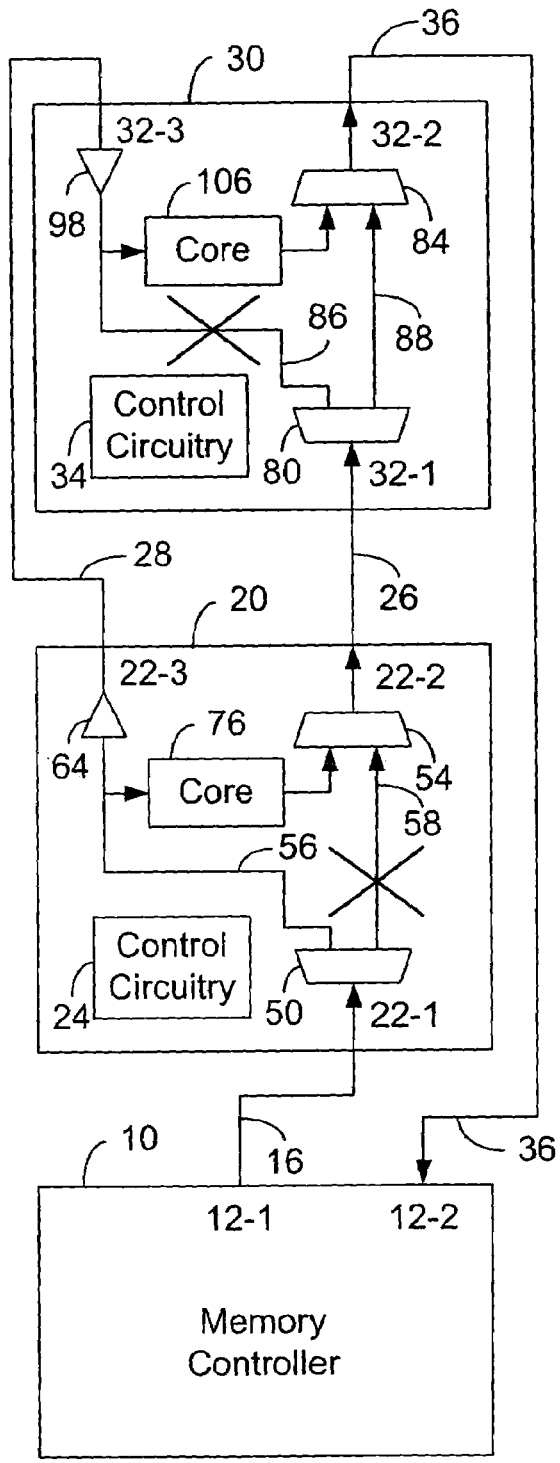
FIGS. 1-3 are each a block diagram representation of a system including first and second memory chips according to some embodiments of the inventions.

Referring to FIG. 1, a memory system includes a memory controller 10 coupled through conductors 16 to a first memory chip 20. Memory chip 20 is coupled through conductors 26 and conductors 28 to a second memory chip 30. Memory chip 30 is coupled through conductors 36 to memory controller 10 making a ring arrangement. Some embodiments do not include some of the details shown in FIG. 1.

Figure 2:
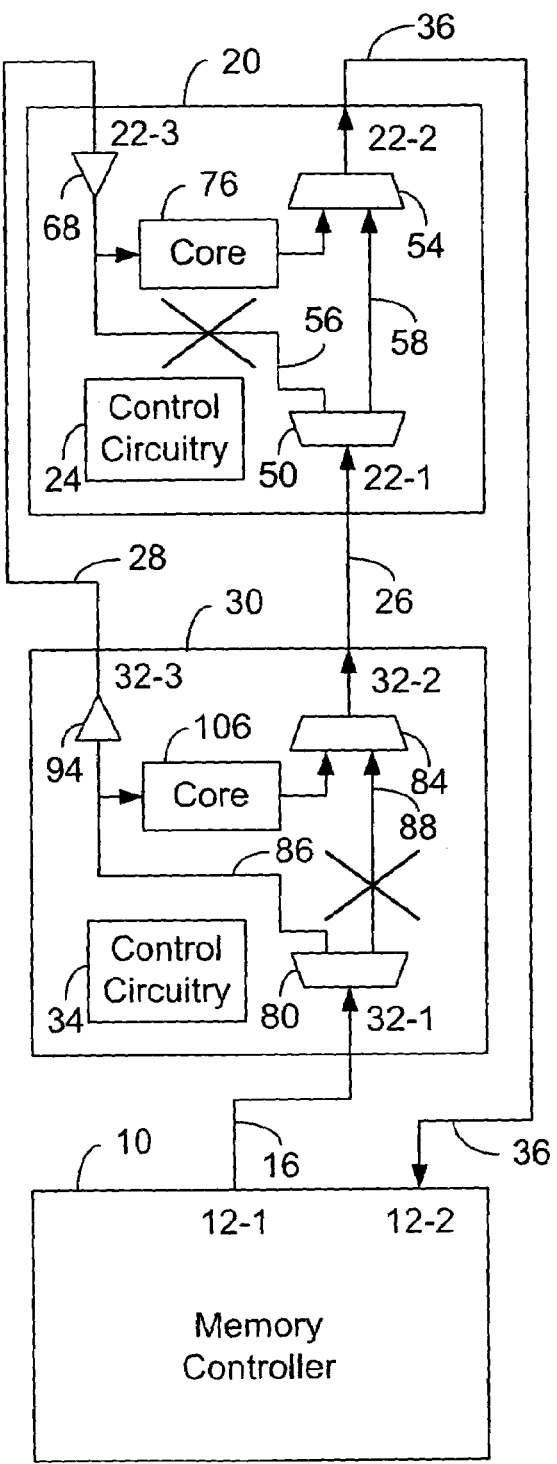

In FIG. 1, chip 20 is in a first position in the system, and control circuitry 24 is in a first position state. Chip 30 is in a second position in the system, and control circuitry 34 is in a second position state. Of course, control circuitry 24 and 34 may simultaneously be in other states regarding other situations. In FIG. 2, chip 20 is in the second position and control circuitry 24 is in the second position state. Chip 30 is in the first position and control circuitry 34 is in the first position state. Memory chips 20 and 30 are manufactured identically, but operate differently when in a different position in the system to allow either the configuration of FIG. 1 or of FIG. 2 without changing the overall operation of the memory system.

In the embodiments of FIGS. 1 and 2, the illustrated conductors between chips carry signals in only one direction. There may be others conductors between chips that carry signals in a unidirectional or bidirectional manner.

Referring to FIG. 1, when control circuitry 24 is in the first position state it causes a selection circuit 50 to pass signals received through ports 22-1 to conductors 56, but not to conductors 58. An "X" on conductors 58 illustrates that signals do not pass through them from ports 22-1. Control circuitry 24 also causes transmitters 64 to be enabled, but does not enable receivers (68 in FIG. 3) coupled to ports 22-3. Read data from a core 76 is provided to selection circuit 54 from which it is transmitted through ports 22-2 to conductors 26 and ports 32-1.

While it is in the second position state, control circuitry 34 causes a selection circuit 80 to pass signals received through ports 32-1 to conductors 88, but not to conductors 86. An "X" on conductors 86 illustrates that signals do not pass through them from ports 32-1. Control circuitry 34 also causes receivers 98 to be enabled, but does not enable transmitters (94 in FIG. 3) coupled to ports 32-3. Read data from a core 106 is provided to selection circuit 84 from which it is transmitted through ports 32-2 to conductors 36 and ports 12-2 of memory controller 10.

Figure 3:
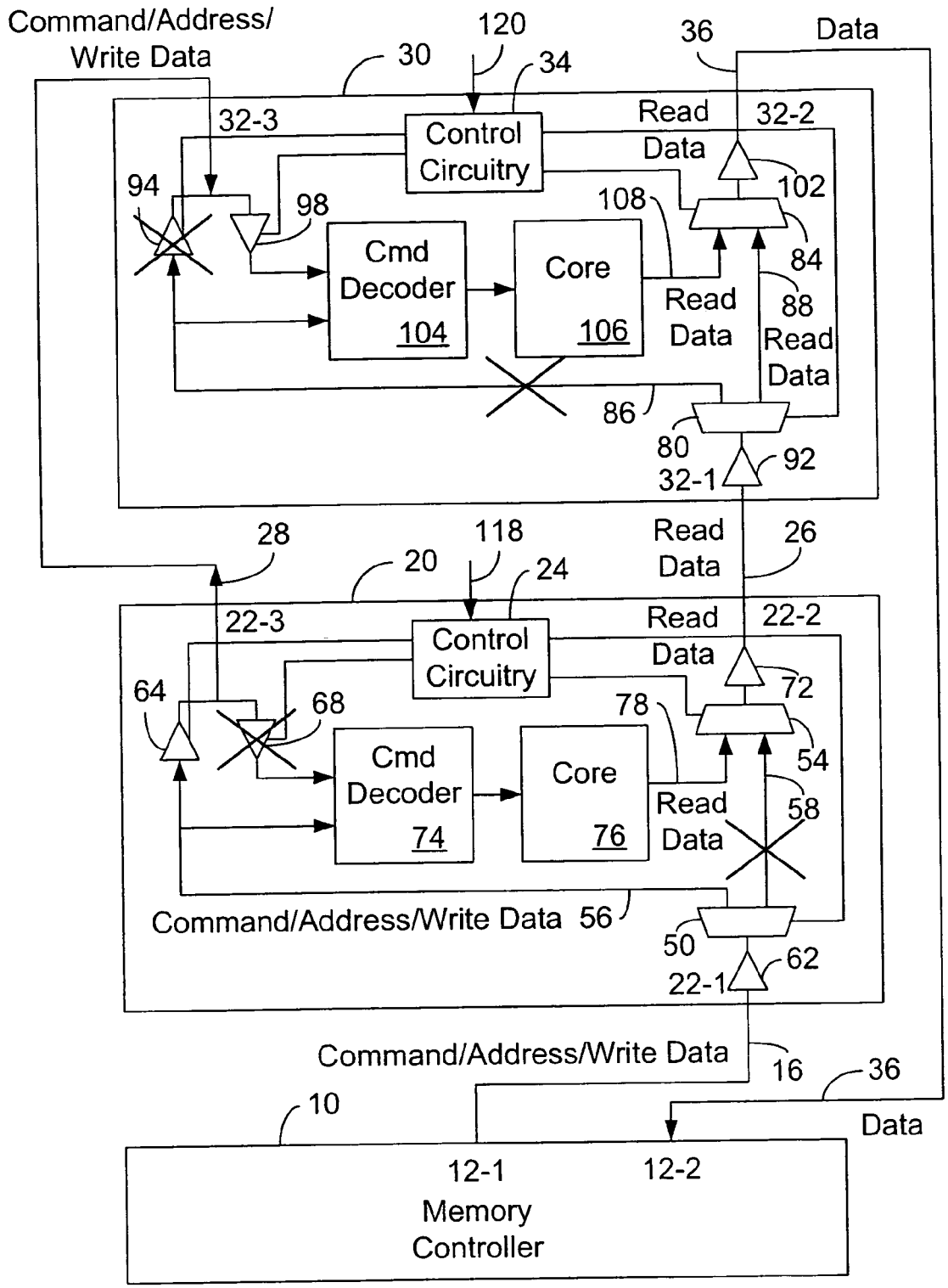

FIG. 3 is similar to FIG. 1 except that it shows some additional detail, which are not used in some embodiments. FIG. 3 shows receivers 68 and transmitters 94 with "X" marks indicating that they are not enabled. FIG. 3 also shows command decoders 74 and 104 that cause operations to be performed on cores 76 and 106. FIG. 3 further identifies that command, address, and write data are sent from memory controller 10 through ports 22-1 to selection circuit 50 through receivers 62. Some commands, such as read commands, are not associated with write data. In some embodiments, there might be some commands with no associated address. Likewise, in some embodiments, there might be write data or addresses with no immediately associated command.

Selection circuit 50 selects that the command, address, and write data is passed through conductors 56 to both the command decoder 74 and through transmitters 64 and ports 22-3 to chip 30. Accordingly, the command, address, and write data is also transmitted through ports 32-3 and receivers 98 to command decoder 104.

Conductors 78 and 108 carry read data from cores 76 and 106 to selection circuits 54 and 84. Read data from chip 20 is passed from selection circuit 54 through transmitters 72 to ports 22-2, conductors 26, ports 32-1 to receivers 92 and selection circuit 80. Selection circuit 80 passes the read data through conductors 88 to selection circuit 84. In the case of FIG. 3, selection circuit 84 acts as a multiplexer between read data from conductors 88 and read data from conductors 108. Transmitters 102 transmit signals from selection circuit 82 to ports 32-2 and conductors 36.

For the embodiments of FIG. 3 (but not for some other embodiments), the following table summarizes the types and direction of the signals.

| Ports | Direction of signals through the ports | Type of signals through the ports |
|---|---|---|
| 22-1, 32-1 | In FIG. 3, ports 22-1 and 32-1 only receive signals. | In FIG. 3, ports 22-1 receive command, address, and write data, and ports 32-1 receive read data. |
| 22-2, 32-2 | In FIG. 3, ports 22-2 and 32-2 only provide signals | In FIG. 3, ports 22-2 and 32-2 provide only read data. |
| 22-3, 32-3 | In FIG. 3, ports 32-3 receive signals and ports 22-3 provide signals. | In FIG. 3, ports 22-3 and 32-3 only provide or receive command, address, and write data. |

In different embodiments, there may be different ways in which commands are communicated to command decoders 74 and 104. For example, in some embodiments, all the commands go to all the chips and command decoders 74 and 104 include address comparators or other circuitry to determine which commands are intended for them. The address comparators or other circuitry may be right before the command decoders. In these embodiments, if a command where intended for only chip 20, it would also be transmitted through transmitters 64 to chip 30. In other embodiments, if a command is directed to chip 20 it may be stripped off so that it does not also go to chip 30, but if it is directed to chip 30 it would go through chip 20. Still other techniques and variations may be used.

In different embodiments, the conductors may have different numbers of lines or lanes (widths). (According to some terminology, in differential serial signaling, a lane includes two lines, whereas with single ended serial signaling, a lane includes one line.) Merely as an example, conductors 16 and conductors 28 each might be six lanes wide, while conductors 26 and conductors 36 each might be eight lanes wide. In this example, the first ports (22-1, 32-1) for both chips 20 and 30 are eight lanes wide. In this example, in the case of FIG. 1, two ports of ports 22-1 are not connected to conductors 16, but all ports of ports 32-1 are connected to conductors 26. In the case of FIG. 2, two ports of ports 32-1 are not connected to conductors 16, but all ports of ports 22-1 are connected to conductors 26. Selection circuits 50 and 80 and perhaps other circuitry respond appropriately. Other possibilities for the number of ports and lines of conductors exist. There may be additional conductors and ports that not controlled by selection circuits 50 and 80 as is described for in FIGS. 1-3. There may be additional ports that are not part of the illustrated ports (for example, not part of ports 22-1, 22-2, 22-3 in chip 20).

FIG. 3 illustrates conductors 118 and 120, which are coupled to control circuitry 24 and 34. Conductors 118 and 120 may each be a single conductor or more than one conductor. Conductors 118 and 120 carry position state control signals to control the position state of control circuitry 24 and 34. In some embodiments, conductors 118 and 120 are not included and the position states of control circuitry 24 and 34 is controlled through other means such as through conductors 16 and 28.

The bidirectional nature of the transmitters and receivers 64, 68 and 94, 98 on either side of conductors 28 may add to the pad capacitance. However, by keeping conductors 28 relatively short, the effect of this additional capacitance can be reduced so that signaling frequency is not overly impacted.

Figure 4:
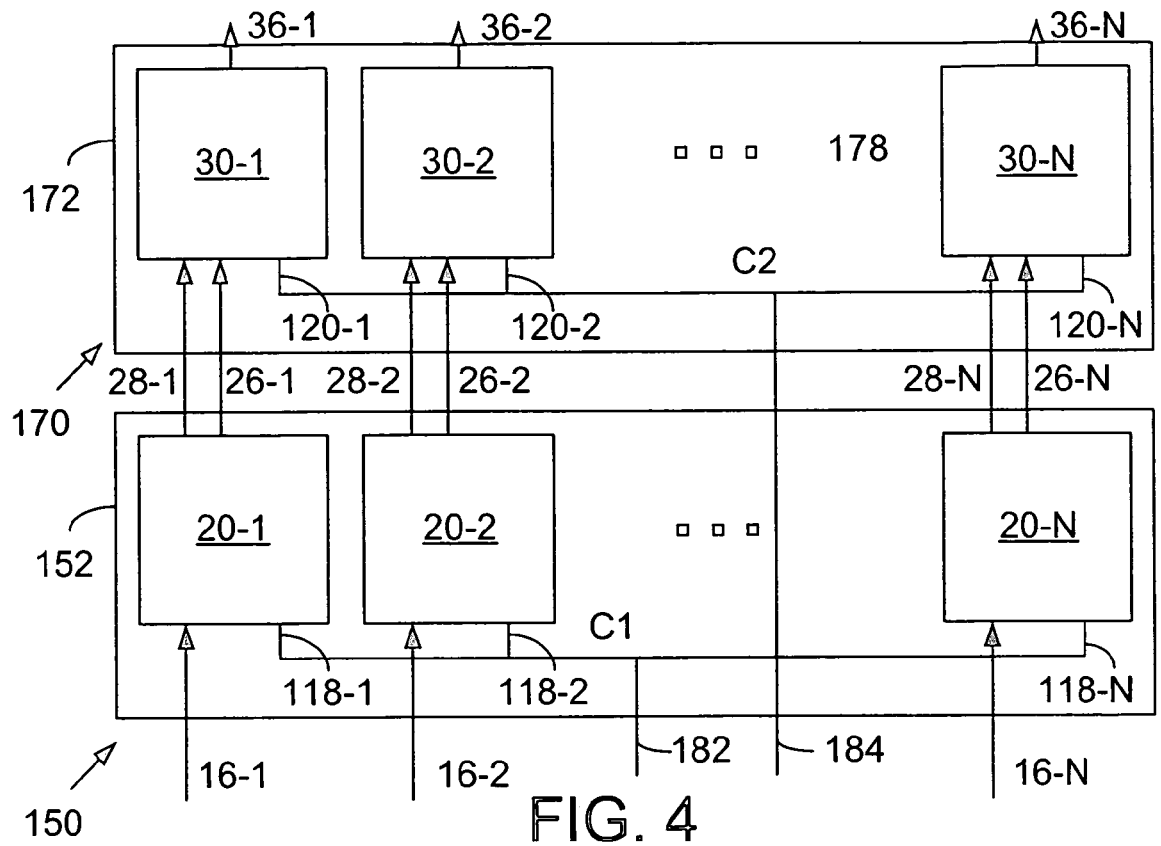
FIG. 4 is a block diagram representation of a system including first and second memory modules according to some embodiments of the inventions.

FIG. 4 illustrates a module 150 that includes a substrate 152 that supports memory chips 20-1, 20-2, . . . 20-N, of which chip 20 in FIGS. 1 and 3 is an example. A module 170 includes a substrate 172 that supports memory chips 30-1, 30-2, . . . 30-N, of which chip 30 in FIGS. 1 and 3 is an example. Conductors 16-1, 16-2 . . . 16-N, conductors 26-1, 26-2, . . . 26-N, conductors 28-1, 28-2, . . . 28-N, and conductors 36-1, 36-2, . . . 36-N carry signals of the type that are on conductors 16, 26, 28, and 36 in FIGS. 1-3, or the signals may be different. There may be other conductors that are not illustrated. Substrates 152 and 172 may also have chips on their other sides.

A conductor(s) 182 and conductor(s) 184 provide position state control signals C1 and C2. Signal C1 is provided through conductors 118-1, 118-2, . . . 118-N to control circuitry in chips 20-1, 20-1, . . . 20-N. Conductor(s) 118 in FIG. 3 is an example of one of conductors 118-1 . . . 118-N. Signal C2 is provided through conductors 120-1, 120-2, . . . 120-N to control circuitry in chips 30-1, 30-1, . . . 30-N. Conductor(s) 120 in FIG. 3 is an example of one of conductors 120-1 . . . 120-N. In FIG. 4, in some embodiments, the voltage of signal C1 is the opposite of the voltage of signal C2. For example, in operation, if C1 is a logical high voltage signal, then signal C2 would be a logical low voltage signal.

There are various ways in which signals C1 and C2 can be generated. One simple approach is to have a circuit on a motherboard provide a voltage for signal C1 and a voltage for signal C2. In some embodiments, all groups of memory chips in the first position can receive signal C1 and all groups of memory chips in the second position can receive signal C2. In some embodiments, signal C2 can be created by inverting signal C1 (see FIG. 5). In some embodiments, the circuit of the motherboard is merely a resistor coupled to the power supply to create signal C1 and an inverter to create signal C2. More complicated circuits could be used. Another approach is to have C1 and/or C2 sent by the memory controller. Still another approach is to have the signal generated on the module. A non-volatile memory on the module can be used to provide information about the position of the group(s) of chips on the module—although this may restrict the flexibility of which position the module may be in. Still other approaches may be used.

The position state of the control circuitry (such as 24 and 34) may be set at boot up (when the computer system starts), after a hot swap of a module, and/or at other times. In some embodiments, the control circuitry latches the values of signal C1 or C2 so that conductors 182 and 184 do not have to remain active, or so conductors 182 and 184 can be also used for other purposes following the setting of the position states.

Figure 5:
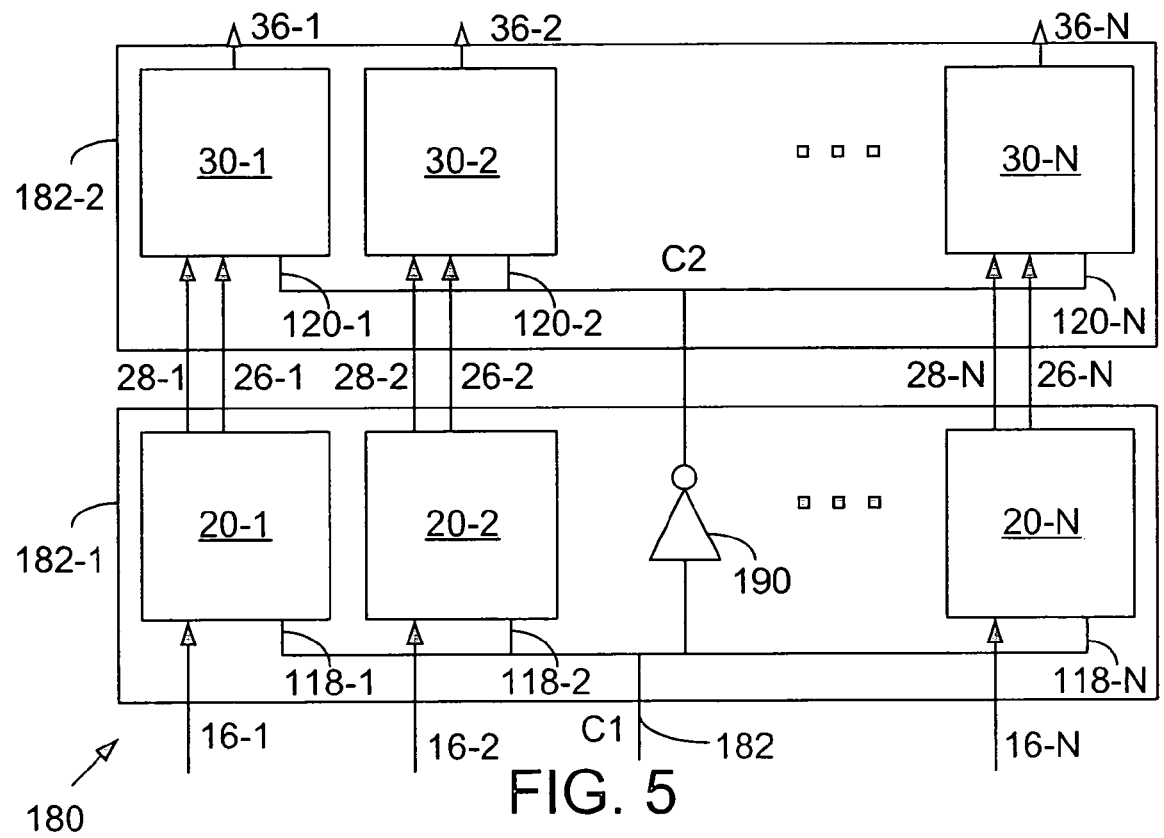
FIG. 5 is a block diagram representation of a system including a memory module according to some embodiments of the inventions.

FIG. 5 is similar to FIG. 4 except that it illustrates a module 180 with a substrate 182 having a first side 182-1 and a second side 182-2. Chips 20-1 . . . 20-2 are on side 182-1 and chips 30-1 . . . 30-2 are on side 182-2. In the example of FIG. 5, signal C1 is received through conductor(s) 182 and signal C2 is created through an inverter 190. However, the system of FIG. 5 could have both signals C1 and C2 come directly from the motherboard, memory controller, the module, or elsewhere.

Figure 6:
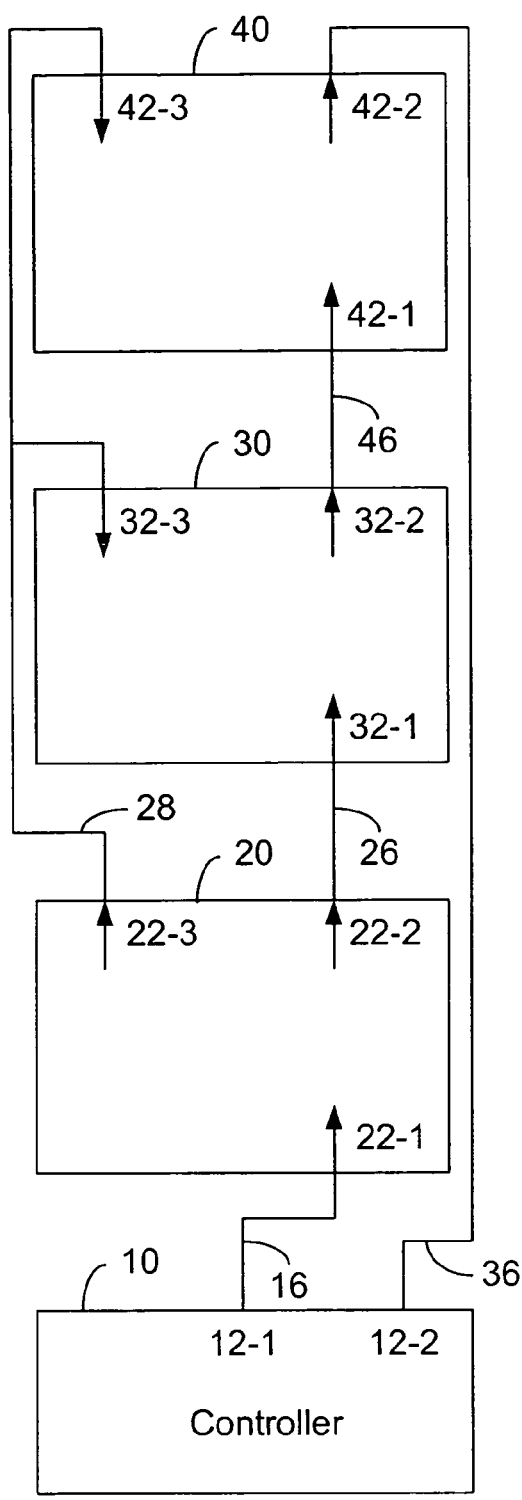
FIGS. 6-7 are each a block diagram representation of a system including memory chips according to some embodiments of the inventions.

FIG. 6 illustrates that more than two memory chips may be in the ring. A memory chip 40 with ports 42-1, ports 42-2, and ports 42-3 is coupled to chip 30. Chip 40 may be identical to chips 20 and 30. Chips 20, 30, and 40 may be in different groups of chips (for example, ranks) or in the same group. Conductors 28 are coupled between ports 22-3, ports 32-3, and ports 42-3 in a star fashion. Although FIG. 6 shows three memory chips in series, in other embodiments, there are more than three memory chips in series with there third ports coupled in a star arrangement. Conductors 46 couple ports 32-2 and 42-1. Conductors 36 couple ports 42-2 to ports 12-2. In some embodiments, the control circuit of chip 40 and control circuitry 34 of chip 30 are both in the second position state, and control circuit 24 of chip 20 is in the first position state. Accordingly, not every chip needs to be considered in a different position in the system for purposes of chip operation. In the case of FIG. 6, chip 20 is in the first position and chips 30 and 40 are in the second position. Chip 40 may be on the same module or in a different module than chips 20 and 30. Chips 20, 30, and 40 may be on the same substrate, three different substrates, or a combination of the two. There may be additional chips in the ring. For simplicity, circuitry in chips 20, 30, and 40 is not illustrated, but it could be the same as or different than in FIG. 3.

Figure 7:
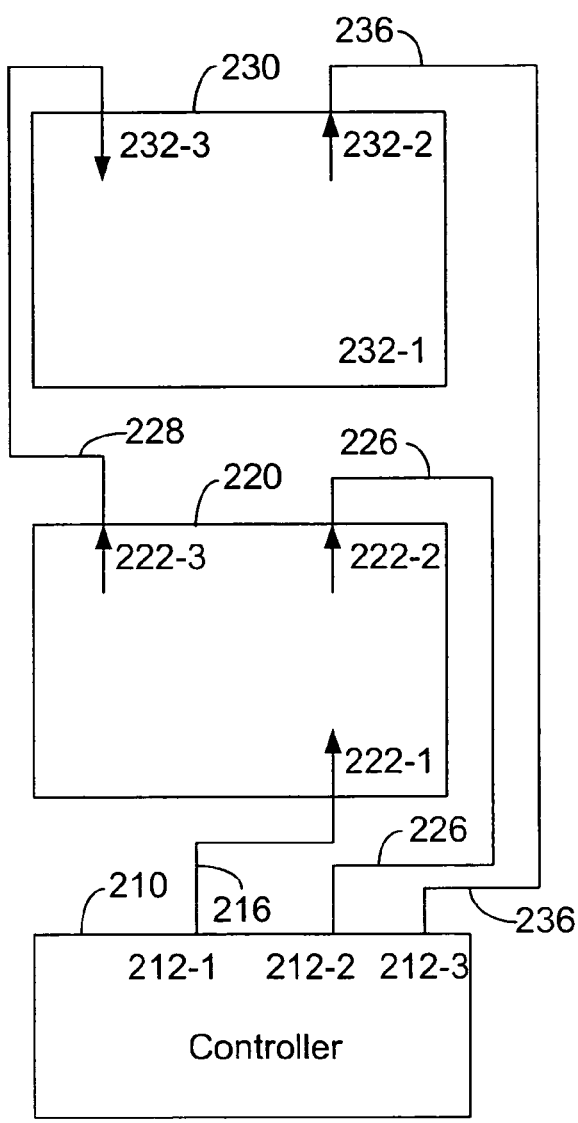

FIG. 7 illustrates a system that is similar to the system of FIG. 1 except that in FIG. 7 that the read data of each memory chip is provided more directly to the memory controller. Referring to FIG. 7, conductors 216 are coupled between ports 212-1 of a memory controller 210 and ports 222-1 of a memory chip 220. Memory controller 210 can be the same as or different than memory controller 10. Conductors 228 are coupled between ports 222-3 of chip 220 and ports 232-3 of memory chip 230. Conductors 226 are coupled between ports 222-2 of chip 220 and ports 212-2 of controller 210. Conductors 236 are coupled between ports 232-2 of chip 220 and ports 212-3.

In some embodiments, the number of lines of conductors 226 and 236 are each one half that of conductors 26 and 36 of FIG. 1. Merely as an example, conductors 26 and 36 may have 8 lanes and conductors 226 and 236 may each 4 lanes, but various other numbers could be involved. Likewise, the number of ports of the sum of ports 212-2 and ports 212-3 may equal the number of ports of ports 12-2 in FIG. 1. The type of signals (for example, command, address, and write date) may be the same on conductors 216 and 228 in FIG. 7 as on conductors 16 and 28 in FIG. 1. Likewise, the type of signals (for example, read data) on conductors 226 and 236 may be the same as on conductors 26 and 36. Also, whether chips 220 and 230 send or receive signals on conductors 228 may depend on their position in the system. The number of lanes of conductors 216 and 228 may be the same as or different than (for example, one half) the number of lanes of conductors 16 and 28.

Figure 8:
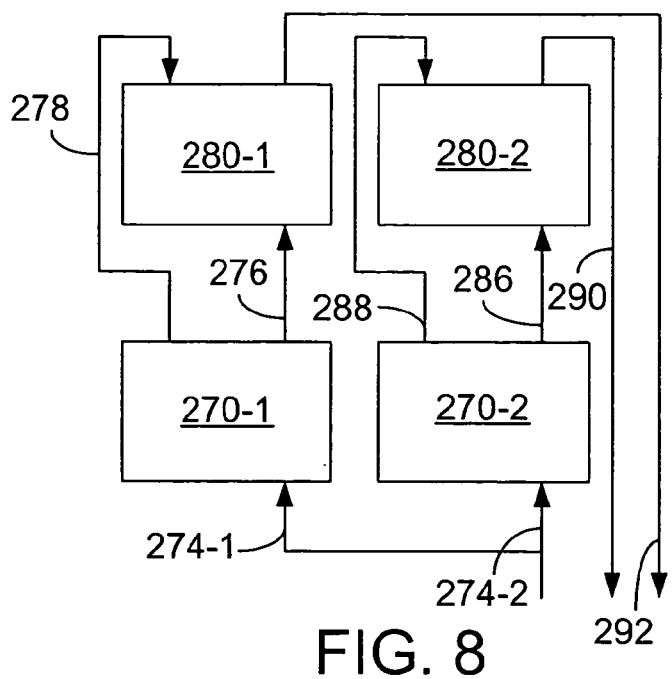
FIG. 8 are each a block diagram representation of an arrangement of memory chips according to some embodiments of the inventions.

FIG. 8 illustrates memory chips 270-1 and 270-2 which receive signals through conductors 274-1 and 274-2. Chip 270-1 is coupled to a memory chip 280-1 through conductors 278 and 276 and chip 270-2 through is coupled to a memory chip 280-2 through conductors 288 and 286. Chips 280-1 and 280-2 provide signals through conductors 290 and 292. In some embodiments, the type of signals on conductors 274-1 and 274-2 are the same as those on conductors 16 in FIG. 1; the type of signals on conductors 278 and 288 are the same as on conductors on conductors 28 of FIG. 1; and the type of signals on conductors 276, 286, 290, and 292 may be the same as on conductors 26 and 36 of FIG. 1. Whether chips 270-1, 270-2, 280-1, and 280-2 send or receive signals on conductors 278 and 288 may depend on their position in the system. The number of lines in conductors 276, 286, 290, and 292 may be the same as in conductors 36 or they are may be some other number, such as one half the number of lines of conductors 36. The number of lines of conductors 274-1, 274-2, 278, and 288 may be the same as or different than (for example, one half) the number of lines of conductors 16 and 28.

Figure 9:
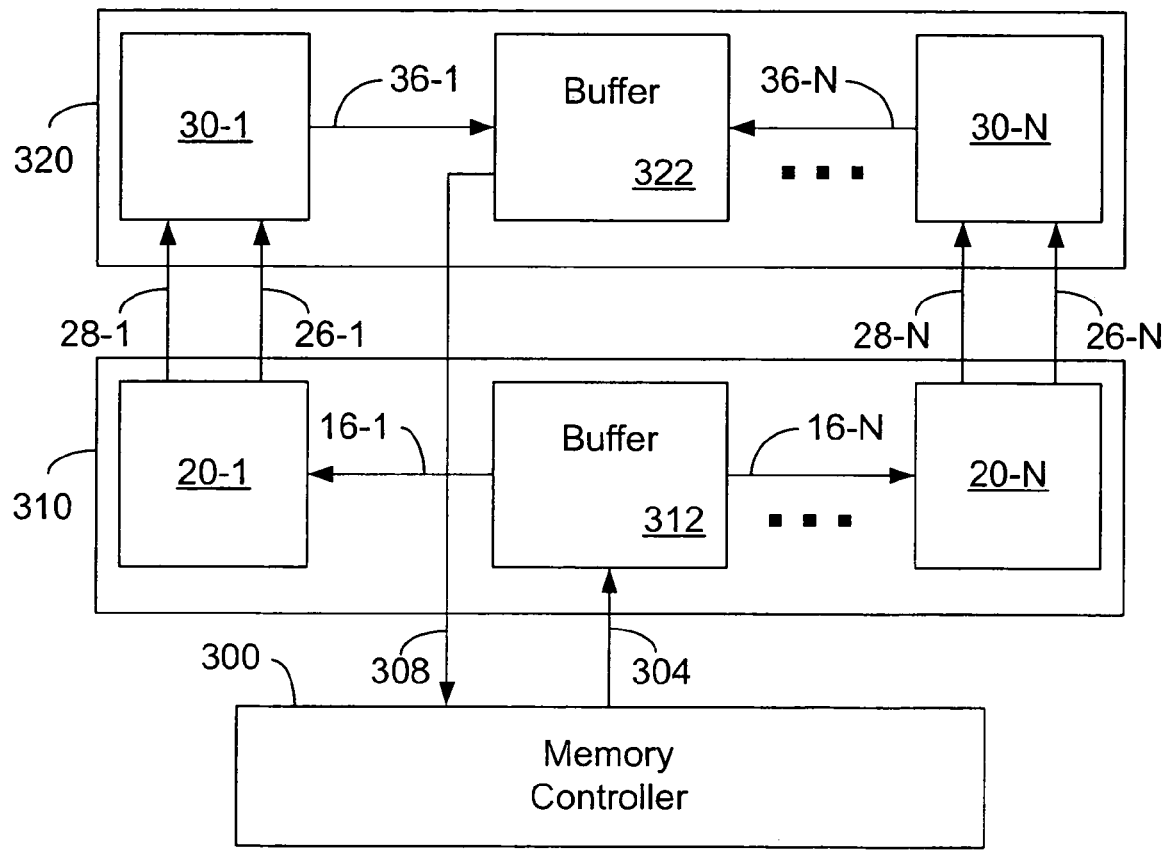
FIG. 9 is a block diagram representation of a system including buffers on modules according to some embodiments of the inventions.

FIG. 9 illustrates a system which operates similar to that of FIGS. 1-4 or FIGS. 1-3 and 5 except that a substrate surface 310 includes buffer 312 along with chips 20-1 . . . 20-N and substrate surface 320 includes a buffer 322 along with chips 30-1 . . . 30-N. Point to point or multidrop conductors may be used between the buffers and memory chips. A memory controller 300 may be the same as or similar to memory controller 10. There may be additional conductors that are not illustrated.

The signals on conductors 304 and 16-1 . . . 16-N in FIG. 9 may be of the same type as the signals on conductors 16 in FIGS. 1-3 and 16-1 . . . 16-N in FIGS. 4 and 5. The signals on conductors 36-1 . . . 36-N and conductors 308 in FIG. 9 may be of the same type as signals on conductors 36 in FIGS. 1-3 and conductors 36-1 . . . 36-N in FIGS. 4 and 5. The signals on conductors 26-1 . . . 26-N and conductors 28-1 . . . 28-N in FIG. 9 may be of the same type as the signals on conductors 26 and 28 in FIGS. 1-3 and conductors 26-1 . . . 26-N and conductors 28-1 . . . 28-N in FIGS. 4 and 5. In some embodiments, the voltage and frequencies and perhaps signaling techniques between memory controller 300 and buffers 312 and 322 may be different than between buffers 312 and 322 and chips 20-1 . . . 20-N and 30-1 . . . 30-N.

In some embodiments, there is a different buffer for every group (for example, rank) of chips. In other embodiments, a buffer can be shared among more than one group of chips. For example, in FIG. 9, buffer 312 might serve the function of both buffers 312 and 322.

FIG. 10 illustrates a system in which memory controller 10 (or another controller in this disclosure) is in a chip 350, which also includes a computer system processor. Chip 310 could include multiple processors and multiple cores. Chip 350 is coupled to an input/output controller 356, which in turn is coupled to a wireless transmitter and receiver 358 for wireless communication. Wireless transmitter and receiver 358 are not required for all embodiments.

FIG. 11 illustrates a system in which memory controller 10 (or another controller in this disclosure) is in a memory controller hub 362, which is coupled to a processor chip 364, and is coupled to a input/output controller 366, which in turn is coupled to wireless transmitter and receiver 358 for wireless communication. As was mentioned, wireless transmitter and receiver 358 are not required for all embodiments.

ADDITIONAL INFORMATION AND EMBODIMENTS

The inventions are not restricted to any particular signaling techniques or protocols. For example, the signaling may be single ended or differential. The signaling may include only two voltage levels or more than two voltage levels. The clock (or strobe) may be transmitted separately from the signals or embedded in the signals. Various coding techniques may be used. Serial or traditional parallel signaling may be used. The signals may be in packetized, multiplexed, or have dedicated lines. For example, command, address, write data signals may be packetized or time multiplexed. Or there could be dedicated lines for commands, dedicated lines for commands, and dedicated lines for write data or some combination of these. The inventions are not restricted to a particular type of transmitters and receivers. Various clocking techniques could be used in the transmitters and receivers and other circuits. The receiver symbols in the figures may include both the initial receiving circuits and the related latching and clocking circuits. According to certain terminology, in some embodiments, the groups of conductors 16, 26, 28, and 36 might be referred to links that includes lanes, but other types of signaling could be used.

In the figures showing one or more modules, there may be one or more additional modules in parallel and/or in series with the shown modules. The memory controller may have more than one channel coupled to the modules.

One or more of the chips in a group may be used primarily for error correction.

Control circuitry 24 and 34 may perform additional functions not described in this disclosure or there may be additional control circuitry not shown. In some embodiments, signals C1 and C2 may be used to convey information in addition to the position state.

There may be a variety of circuits in the chips which are not illustrated in the figures. When the figures show two blocks connected through conductors, there may be intermediate circuitry that is not illustrated. The shape and relative sizes of the blocks is not intended to relate to actual shapes and relative sizes.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments.

When it is said the element "A" is coupled to element "B," element A may be directly coupled to element B or be indirectly coupled through, for example, element C.

When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification states a component, feature, structure, process, or characteristic "may", "might", or "could" be included, that particular component, feature, structure, process, or characteristic is not required to be included. If the specification or claim refers to "a" or "an" element, that does not mean there is only one of the element. If the specification or claims refer to "an additional" element, that does not preclude there being more than one of the additional element.

The inventions are not restricted to the particular details described herein. Indeed, many other variations of the foregoing description and drawings may be made within the scope of the present inventions. Accordingly, it is the following claims including any amendments thereto that define the scope of the inventions.

What is claimed is:

1. A memory chip comprising:
   a memory core, control circuitry, and first ports, second ports, and third ports;
   wherein the first ports are to only receive signals, the second ports are to only provide signals, and the control circuitry is to control whether the third ports are to only receive signals or only provide signals, wherein the control circuitry is to receive a position state control signal and place itself in a first position state if the control signal has a first value and place itself in a second position state if the control signal has a second value.

2. The chip of claim 1, wherein when the chip is in a first position in a system, the control circuitry is in a first position state, and when the chip is in a second position in the system, the control circuitry is in a second position state.

3. The chip of claim 1, wherein if the control circuitry is in the first position state, the number of the first ports that are operational is different than if the control circuitry is in the second position state.

4. The chip of claim 1, further comprising transmitters and receivers coupled to the third ports, and wherein if the control circuitry is in the first position state it activates the transmitters but not the receivers, and if the control circuitry is in the second position state it activates the receivers but not the transmitters.

5. The chip of claim 4, further comprising a command decoder circuit coupled to the core, and first and second selection circuits coupled to the first and second ports, respectively, and wherein if the control circuitry is in the first position state it directs the first selection circuitry to pass signals received from the first ports to the transmitters and the command decoder, but not to the second selection circuit, and if the control circuitry is in the second position state it directs the first selection circuitry to pass signals received from the first ports to the second selection circuit, but not to the transmitters and command decoder.

6. The chip of claim 1, further comprising a command decoder coupled to the core, and wherein if a command is directed to the chip and is a read command, the command decoder causes a read operation to be performed on the core, and resulting read data is provided from the core to the second selection circuit, which in turn provides the read data to the second ports.

7. The chip of claim 1, wherein the second ports are to provide only read data.

8. A system comprising:
   first and second chips each including a memory core, control circuitry, and first ports, second ports, and third ports; and
   wherein for the first and second chips, the first ports are to only receive signals, the second ports are to only provide signals, and the control circuitry is to control whether the third ports are to only receive signals or only provide signals, and wherein the third ports of the first chip are coupled to the third ports of the second chip.

9. The system of claim 8, further comprising a memory controller coupled to the first ports of the first chip, and wherein the control circuitry of the first chip is to direct transmitters in the first chip to transmit signals through the third ports of the first chip to the third ports and receivers of the second chip, and the second ports of the first chip are coupled to the first ports of the second chip.

10. The system of claim 9, wherein in operation, the signals received through the first ports of the first chip are address, command, and write data signals from the memory controller, and wherein the signals provided by the second ports of the first chip to the first ports of the second chip are read data signals.

11. The system of claim 8, wherein in operation, the first ports of the first chip and the third ports of the second chip receive only command, address, and write data signals, and the second ports of the first chip and second ports of the second chip provide only read data.

12. The system of claim 8, wherein the first chip is part of a first group of chips coupled to a memory controller and the second chip is part of a second group of chips coupled between the first group of chips and the memory controller.

13. The system of claim 8, further comprising a memory controller coupled to the first chip, and a third chip coupled between the second chip and the memory controller.

14. The system of claim 8, further comprising first and second module substrates to support the first and second chips, respectively, and wherein the first module substrate further supports additional chips that are the same as the first chip and the second module substrate further supports additional chips that are the same as the second chip.

15. The system of claim 14, wherein the first and second module substrates each include a buffer to interface with the chips on the module substrate.

16. The system of claim 8, further comprising module substrate having a first side to support the first chip and other chips in a same rank as the first chip and a second side to support the second chip and other chips in a same rank as the second chip.

17. The system of claim 8, further comprising a memory controller coupled to the first chip, wherein the memory controller is also coupled to a wireless transmitter and receiver.

18. A method comprising:
placing a first and a second group of chips in a computer system, wherein the chips of the first and second groups each have control circuitry;
causing the control circuitry of the first group of chips to be in a first position state and causing the control circuitry of the second group of chips to be in a second position state; and
wherein first ports of each of the chips only receive signals, second ports of each of the chips only provide signals, and the control circuitry in the first group of chips causes the first group of chips to only provide signals through third ports of the first group of chips, and the control circuitry in the second group of chips causes the second group of chips to only receive signals through third ports of the second group of chips.

19. The method of claim 18, wherein the signals received through the first ports of the first chip are address, command, and write data signals from a memory controller, and wherein the signals provided by the second ports of the first chip to the first ports of the second chip are read data signals.

20. The method of claim 18, wherein the first ports of the first chip and the third ports of the second chip receive only command, address, and write data signals, and the second ports of the first chip and second ports of the second chip provide only read data signals.

21. The method of claim 18, further comprising coupling a memory controller to the first group of chips, and coupling a third group of chips between the second group of chips and the memory controller.

22. The method of claim 18, further comprising placing the first group of chips on a first module substrate and placing the second group of chips on a second module substrate.

* * * * *